United States Patent [19]

Roschmann

[11] 4,096,461

[45] Jun. 20, 1978

[54] MAGNET SYSTEM FOR TUNABLE YIG OSCILLATOR AND TUNABLE YIG FILTER

[75] Inventor: Peter Roschmann, Hamburg, Germany

[73] Assignee: U.S. Philips Corporation, New York, N.Y.

[21] Appl. No.: 763,625

[22] Filed: Jan. 28, 1977

Related U.S. Application Data

[63] Continuation of Ser. No. 601,641, Aug. 4, 1975, abandoned.

[30] Foreign Application Priority Data

Aug. 23, 1974 Germany ............................ 2440484

[51] Int. Cl.² ................................................ H01F 1/00
[52] U.S. Cl. ................................. 335/209; 333/30 M
[58] Field of Search ............... 335/209, 219, 297, 298, 335/210; 333/30 M

[56] References Cited

U.S. PATENT DOCUMENTS

| | | | |
|---|---|---|---|
| 3,197,678 | 7/1965 | Primas | 335/209 |
| 3,290,610 | 12/1966 | Auld et al. | 333/30 M |
| 3,436,587 | 4/1969 | Meyerer | 335/210 |
| 3,668,568 | 6/1972 | Morgenthaler | 333/30 M |
| 3,789,335 | 1/1974 | Delphin et al. | 335/210 |
| 3,864,647 | 2/1975 | Bongianni | 333/30 M |

*Primary Examiner*—Harold Broome
*Attorney, Agent, or Firm*—Frank R. Trifari; Carl P. Steinhauser

[57] ABSTRACT

A magnet system for compensating the frequency difference between the oscillator frequency $f_o$ of a YIG oscillator and the central filter frequency $f_{mi}$ of a YIG filter to be independent of the oscillator frequency in which two pole-pieces are provided having opposing surfaces, one which has a raised portion, and one of which has a plate of magnetic material having a saturation magnetization smaller than the smallest field strength desired. The raised surface portion of the pole-piece has a height at which the frequency $f_o$-$f_{mi}$ is independent of $f_o$.

5 Claims, 12 Drawing Figures

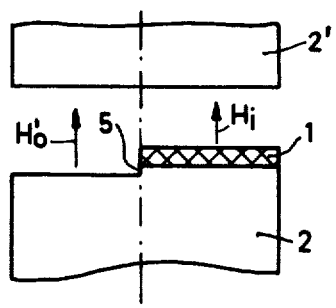
Fig. 4
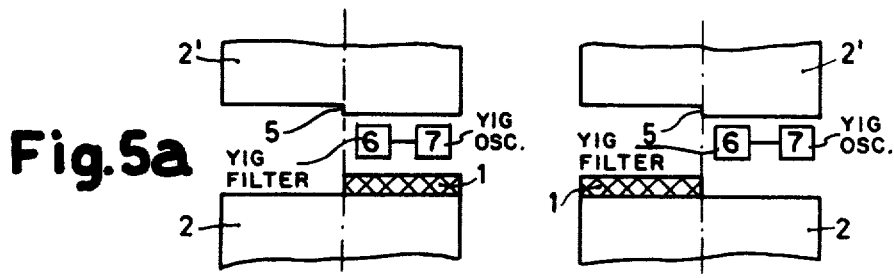
Fig. 5a
Fig. 5b
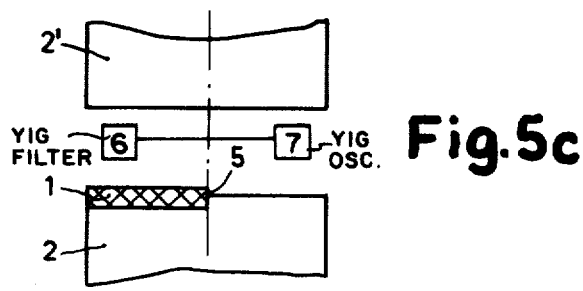
Fig. 5c
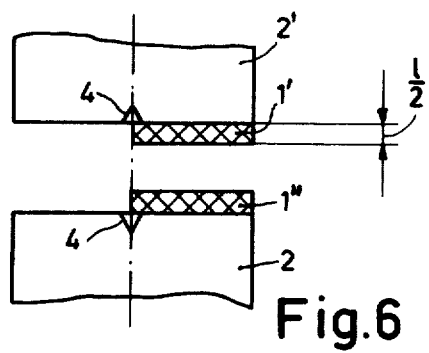
Fig. 6

MAGNET SYSTEM FOR TUNABLE YIG OSCILLATOR AND TUNABLE YIG FILTER

This is a continuation, of application Ser. No. 601,641, filed Aug. 4, 1975 now abandoned.

The invention relates to a magnet system with electro-magnetically or with mechanically variable permanent-magnetic excitation of variable magnet fields.

In the case of cooperation of several tunable YIG-components in a system it is for example necessary that the tuning characteristics of the YIG filters and YIG-oscillators are in accordance with each other. With YIG-components, which exhibit a typical linearity deviation of 0.1% from the ideal linear tuning curve, this can be realized. Generally, a separate electromagnet system is then used for each YIG component. This is very expensive, in particular owing to the high accuracy requirements which are imposed on the electronic control circuitry and the complex adjustment procedures.

It is an object of the invention to provide a tunable magnet system, in which with simple means two or more variable magnetic fields with a constant field-strength can be produced.

According to the invention said object is achieved in that for producing two or more variable magnetic fields with a constant field-strength difference relative to each other or with a field-strength difference which depends on the absolute field-strength in the air gap between the pole faces one or more plates of a magnetic material with a saturation magnetisation which is smaller than the smallest magnetic field-strength which is required, are disposed on various areas of a pole face.

The principle of the solution is independent of its application to YIG components, but it is extremely suitable for this purpose, because the magnet system according to the invention may be used for simultaneously tuning several tunable YIG filters and YIG oscillators, in the case that a constant frequency difference should be obtained between the central frequency of the filter and the resonant frequency of the oscillator throughout the tuning range. This is for example a requirement in the case of tunable superheterodyne microwave receivers with a YIG filter for input selection (image frequency rejection).

The drawing shows some embodiments. In the drawing

Figure 8A:
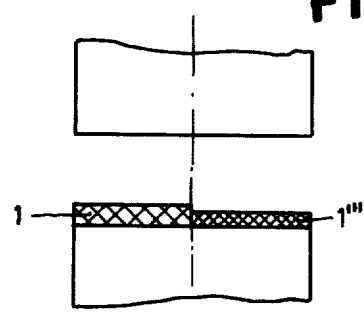

FIGS. 4, 5a - c, FIG. 6, FIGS. 7a, b, FIGS. 8a, b show modifications of the magnet system in a schematic side view and top-plan view respectively.

When a ferrimagnetic material with a smaller saturation magnetisation is additionally inserted in a part of the air-gap volume of the tuning magnet, the saturation magnetisation $4\pi M_s$ should comply with the following relation:

$$4\pi M_s \leq f_{min}/\gamma \quad (1)$$

where $\gamma = 2.8$ MHz/Oe, the so-called gyromagnetic ratio and $f_{min}$ is the lowest operating frequency of the YIG component to be tuned. Generally, the saturation magnetisation should therefore be smaller than the minimum operating field strength in the air-gap, in order to magnetically saturate the additional material introduced in the air-gap. For YIG-component applications the minimum operating field-strength for the ferrimagnetic resonance $f_r$ in a sphere in the magnetic field $H_o$ can be derived from the known tuning equation:

$$f_r = \leq H_o \quad (2)$$

After the material saturation is reached the additional material introduced in the air gap contributes to the field strength in the air gap by a constant amount of $4\pi M_s$ which is independent of the magnetic field strength $H_o$.

Figure 1:
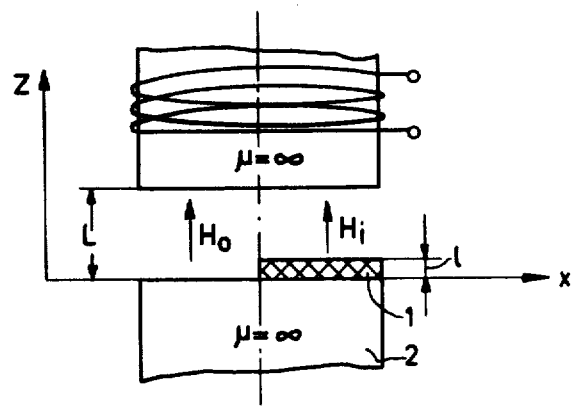
FIG. 1 is a schematic side view of a magnet pole system.

In the schematically shown arrangement of FIG. 1 a plate 1 consisting of a ferrimagnetic material with a low $4\pi M_s$ value is additionally inserted between the pole-pieces 2 and 2' of the tuning magnet, which consists of a material with a high permeability, so that the flux J.w produced by the coil 3 in the air gap with the height L produces a magnetic field $H_o$ of a magnitude:

$$H_o = (J \cdot w/L) \quad (3)$$

For this it is assumed that the reluctance in the pole and in the yoke of the magnet system is negligible. When as an auxiliary quantity the field in the plate 1 is designated $H_M$, the following relations will be valid after saturation of the plate 1 is obtained, taking into account the air-gap induction B, which induction at the bounding faces should be constant in the direction of the surface normals (FIG. 1).

$$H_1 = B/\mu_o \quad (4)$$

$$H_M = B/\mu_o - 4\pi M_s \quad (5)$$

$$H_1(L-d) + H_M \cdot d = H_o \cdot L \quad (6)$$

From (4), (5) and (6) the following relation can be derived:

$$(H_1 - H_o) = 4\pi M_s \cdot d/L \quad (7)$$

where $d$ is the thickness of the plate 1.

Equation (7) describes the dependence of the field strength difference $(H_1 - H_o)$ on the dimensioning and on the material parameter $4\pi M_s$, and also reveals that its magnitude, as required, remains constant in the case of variations of $H_o$.

Figure 2:
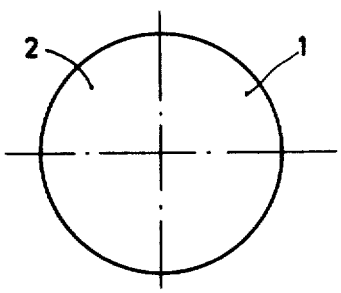
FIG. 2 is a schematic top plan view of a pole face.

In an experimental arrangement according to FIG. 1 and FIG. 2 a frequency difference $f_D$ from 195 to 210 MHz was measured over the frequency range between 4 - 10 GHz for a semicircular plate 1 having a thickness $d = 0.5$ mm and with $4\pi M_s \approx 500$ G in an air gap with a height $L = 3.5$ mm, in accordance with the value calculated in (2) and (7) of:

$$f_D = \gamma \cdot 4M_s d/L = 2.8 \cdot 500 \cdot 0.5/3.5 \approx 200 \text{ MHz}.$$

Suitable additional materials to be inserted in the air gap are especially ferrites of the group of gadolinium + aluminum, gadolinium, dysprosium, holmium substituted garnets, which exhibit an approximately constant saturation magnetisation over a wide temperature range between −80° and +100° C and which consequently meet the generally essential requirement for technical applications of constancy of the parameters, in this case field difference and frequency difference depending on the ambient temperature. Moreover, said group of materials enables a wider variation in the choice of the quantities of the equations (1) and (7), thus allowing constructional modifications in the technical realisation.

Figure 3:
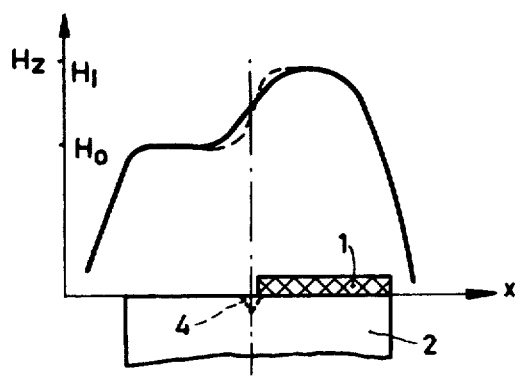
FIG. 3 shows a magnetic field curve with one pole face.
Figure 7A:
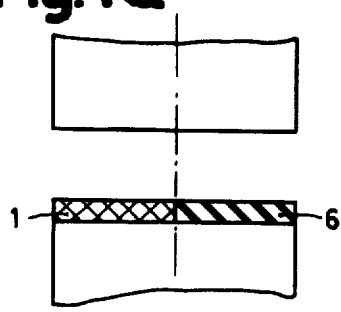

An important property is the variation of the field-strength component in the Z-direction depending on the X-direction shown in FIG. 1. Said variation is shown in FIG. 3. By means of a notch 4 in the polepiece 2 it is possible to increase the steepness of the flank between the two plateaus of the field strengths $H_o$ and $H_1$ and thus to increase the range of homogeneous field strength. As YIG components require a homogeneous tuning field in a specific range of minimum area, the absolute dimensions of the polepiece may be reduced correspondingly and the YIG components may also spatially be arranged more closely to each other owing to the extension of the homogeneous range of the field strengths $H_o$ and $H_1$ obtained by means of the notch 4.

When the principle of the invention is applied to a combination of a tunable YIG filter 6 and a tunable YIG oscillator 7 a special property of YIG-tunable oscillators is to be allowed for under certain conditions. Depending on the circuit arrangement and the types of active semiconductor used (transistor, basic element, tunnel element, avalanche diode said oscillators exhibit the effect that the oscillation frequency $f_o$ in the tuning range relative to the resonant frequency $f_r$ (equation (2)) of the YIG sphere is shifted from slightly below to slightly above $f_r$. This is based on the fact that the semiconductor, in addition to the negative HF resistance, generally has a frequency dependent reactance and that for coupling the YIG sphere transformation circuits are employed whose phase is frequency-dependent. These two effects are compensated for by an operating point on the resonance curve of the YIG resonance, which deviates from the resonant frequency $f_r$ of the YIG sphere, so that for the oscillator the sum of the reactance becomes zero at the resonant frequency $f_o$. In the case of a YIG-filter/YIG oscillator combination, which is located either in the same magnetic field or in two adjoining magnetic fields with a constant field shift, this may lead to a frequency difference between the oscillator frequency $f_o$ and the central filter frequency $f_{mi} = f_r$ which is proportional to the oscillation frequency. With the aid of a small step 5, as shown in FIG. 4, a frequency difference between $H_o'$ and $H_1'$ proportional to the magnetic field can be obtained, whose magnitude can be derived from simple linear relations with (3). By a suitable height of the step 5 the above-mentioned frequency difference $f_o - f_{mi}$, which is proportional of the oscillation frequency, can be compensated for so that $f_o - f_{mi}$ becomes independent of $f_o$. FIGS. 5$a$ – $c$ show some schematic modifications.

In the case of higher values of the field shift the thickness $d$ of the disc 1 becomes very great in accordance with equation (7), in particular for low microwave frequencies, on account of the requirement (1). It is then effective to divide the plate 1 in accordance with FIG. 6 into 1' and 1'', in order that the field homogeneities in the transition region between $H_o$ and $H_1$ can be minimized.

Figure 7B:
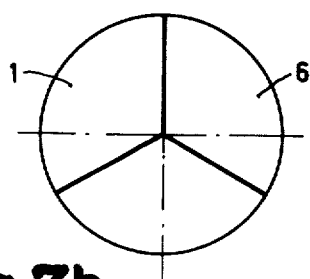
Figure 8B:
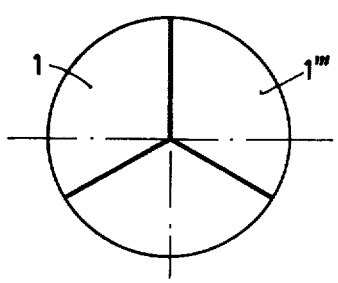

The embodiments described so far may also be effectively extended so as to obtain more than two magnetic fields each with a constant field-strength difference relative to each other. Two schematic arrangements for producing three different magnetic fields with a constant field-strength difference by means of plates 1 and 6 of materials with a different $4\pi M_s$ are shown in FIGS. 7$a$, $b$ and with a different thickness $d$ of the same material 1' and 1''' in FIGS. 8$a$, $b$.

Furthermore, the principle described may also be employed for magnet systems with permanent-magnetic excitation for producing two or more magnetic fields with constant field-strength difference. With the aid of a mechanically adjustable "magnetic shunt", preferably in the area of the permanent magnet, it is also possible in this arrangement to vary the absolute value of the various field strengths, while maintaining the constant field-strength difference.

What is claimed is:

1. A magnet system for tuning the combination of a tunable YIG filter having a center frequency $f_{mi}$ and a tunable YIG oscillator having a frequency $f_o$ comprising a pair of spaced pole-pieces having opposing surfaces forming a magnetic field therebetween, one of said surfaces having portion which is raised above the other portion a distance at which the frequency difference $f_o - f_{mi}$ is independent of $f_o$, and a plate of magnetic material on one said surfaces having a saturation magnetization which is smaller than the smallest magnetic field strength required.

2. A magnet system as claimed in claim 1 in which the plate of magnetic material is disposed opposite the raised surface portion.

3. A magnet system as claimed in claim 1 in which the plate of magnetic material is disposed opposite the non-raised portion.

4. A magnet system as claimed in claim 1 in which the plate of magnetic material is disposed on the non-raised surface portion.

5. A magnet system as claimed in claim 1 in which the magnetic material is selected from the group consisting of gadolinium + aluminum, dysprosium, and holmium substituted yttrium-iron garnets with a temperature-compensated saturation magnetization.

* * * * *